(12) United States Patent
Kim et al.

(10) Patent No.: US 7,973,325 B2
(45) Date of Patent: Jul. 5, 2011

(54) REFLECTIVE ELECTRODE AND COMPOUND SEMICONDUCTOR LIGHT EMITTING DEVICE INCLUDING THE SAME

(75) Inventors: Mi-yang Kim, Gwangju-si (KR); Joon-seop Kwak, Gyeonggi-do (KR)

(73) Assignee: Samsung Electronics Co., Ltd. (KR)

(*) Notice: Subject to any disclaimer, the term of this patent is extended or adjusted under 35 U.S.C. 154(b) by 238 days.

(21) Appl. No.: 11/157,971

(22) Filed: Jun. 22, 2005

(65) Prior Publication Data

US 2006/0081867 A1 Apr. 20, 2006

(30) Foreign Application Priority Data

Oct. 7, 2004 (KR) .................. 10-2004-0079963

(51) Int. Cl.
*H01L 33/00* (2010.01)
(52) U.S. Cl. ............ 257/94; 257/745; 257/11; 257/762; 257/99; 257/E33.016
(58) Field of Classification Search .............. 257/11, 257/13, 745, 762, 79–103; 438/22, 25, 26, 438/27, 29, 28
See application file for complete search history.

(56) References Cited

U.S. PATENT DOCUMENTS

| | | | |
|---|---|---|---|
| 6,121,635 A * | 9/2000 | Watanabe et al. ............ 257/91 |
| 6,514,782 B1 | 2/2003 | Wierer, Jr. et al. | |
| 6,969,874 B1 * | 11/2005 | Gee et al. ............ 257/98 |
| 6,992,334 B1 | 1/2006 | Wierer, Jr. et al. | |
| 7,245,341 B2 * | 7/2007 | Yokoyama ............ 349/122 |
| 2002/0014630 A1 | 2/2002 | Okazaki et al. ............ 257/79 |
| 2003/0209720 A1 * | 11/2003 | Okazaki et al. ............ 257/98 |
| 2003/0222270 A1 | 12/2003 | Uemura | |
| 2004/0222434 A1 | 11/2004 | Uemura et al. | |
| 2004/0256632 A1 | 12/2004 | Stein et al. | |
| 2005/0133797 A1 | 6/2005 | Seong et al. | |
| 2005/0179051 A1 | 8/2005 | Kondoh et al. | |
| 2005/0269588 A1 * | 12/2005 | Kim et al. ............ 257/99 |
| 2006/0071224 A1 * | 4/2006 | Baur et al. ............ 257/98 |

FOREIGN PATENT DOCUMENTS

| | | |
|---|---|---|
| CN | 1330416 | 1/2002 |
| CN | 1330416 A | 1/2002 |
| DE | 199 21 987 | 11/1999 |
| EP | 0 926 744 | 6/1999 |
| JP | 405211347 A * | 8/1993 |
| JP | 06-045651 | 2/1994 |
| JP | 6-45651 A | 2/1994 |
| JP | 11-186599 | 7/1999 |
| JP | 11-220171 | 8/1999 |
| JP | 2001-210868 | 8/2001 |
| JP | 2002-335014 | 11/2002 |
| JP | 2003-168823 | 6/2003 |
| JP | 2004-260178 | 9/2004 |
| JP | 2005-184005 | 7/2005 |
| JP | 05-291621 | 1/2009 |

OTHER PUBLICATIONS

First Office Action issued in Chinese Patent Application No. 2005-100786405 on Aug. 10, 2007 with English Translation.

(Continued)

*Primary Examiner* — Jerome Jackson, Jr.
*Assistant Examiner* — Dale Page
(74) *Attorney, Agent, or Firm* — Cantor Colburn LLP

(57) ABSTRACT

Provided are a reflective electrode and a compound semiconductor light emitting device having the reflective electrode, such as LED or LD is provided. The reflective electrode formed on a p-type compound semiconductor layer of a compound semiconductor light emitting device, comprising a first electrode layer formed one of a Ag and Ag-alloy and forms an ohmic contact with the p-type compound semiconductor layer, a third electrode layer formed of a material selected from the group consisting of Ni, Ni-alloy, Zn, Zn-alloy, Cu, Cu-alloy, Ru, Ir, and Rh on the first electrode layer, and a fourth electrode layer formed of a light reflective material on the third electrode layer.

22 Claims, 5 Drawing Sheets

OTHER PUBLICATIONS

Second Office Action issued in Chinese Patent Application No. 2005-100786405 on Feb. 1, 2008 with English Translation.

Hibbard et al., "Low Resistance High Reflectance Contacts to *p*-GaN using Oxidized Ni/Au and Al or Ag" Applied Physics Letters, 2003, vol. 83, No. 2, pp. 311-313.

Song et al., "Low-Resistance and Highly-Reflective Zn—Ni Solid Solution/Ag Ohmic Contacts for Flip-Chip Light-Emitting Diodes" Applied Physics Letters, 2003, vol. 83, No. 24, pp. 4990-4992.

European Search Report in Application No. 05253838.6-1235 dated Sep. 24, 2008.

Office Action issued by Japanese Patent Office on Nov. 4, 2008.

* cited by examiner

REFLECTIVE ELECTRODE AND COMPOUND SEMICONDUCTOR LIGHT EMITTING DEVICE INCLUDING THE SAME

This application claims the priority of Korean Patent Application No. 10-2004-0079963, filed on Oct. 7, 2004, in the Korean Intellectual Property Office, the disclosure of which is incorporated herein in its entirety by reference.

BACKGROUND OF THE DISCLOSURE

1. Field of the Disclosure

The disclosure relates to a reflective electrode and a compound semiconductor light emitting device having the same, and more particularly, to a reflective electrode having low contact resistance, high reflectance, and improved electric conductivity and a compound semiconductor light emitting device having the same.

2. Description of the Related Art

Compound semiconductor light emitting devices can convert an electrical signal to light using a characteristic of a compound semiconductor. Recently, laser light of a semiconductor laser diode, such as a light emitting diode (LED) or a laser diode (LD), is practically used fields, such as optical communications, multiple communications, and space communications. A semiconductor laser is widely used as a light source for transmitting data, recording data, or reading data in a device such as compact disc players (CDP) or digital versatile disc players (DVDP), or optical communications.

The compound semiconductor light emitting device can be classified as a top-emitting light emitting diode (TLED) and a flip-chip light emitting diodes (FCLED) according to the direction of light emission.

The TLED has a light emitting structure in which light is emitted through a p-type electrode that forms an ohmic contact with the p-type compound semiconductor layer. The p-type electrode has a structure of sequentially stacked of a nickel (Ni) layer and a gold (Au) layer on the p-type compound semiconductor layer. However, the p-type electrode formed of Ni layer/Au layer is semitransparent, and a TLED to which the p-type electrode is applied has a low light utilization efficiency and low brightness.

The FCLED has a light emitting structure in which light generated from an active layer is reflected by a reflective electrode formed on the p-type compound semiconductor layer and the reflected light is emitted through a substrate. The reflective electrode can be formed of a material having a superior light reflection characteristic, such as silver (Ag), aluminum (Al), or rhodium (Rh). A FCLED to which the reflective electrode is applied has high light utilization efficiency and high brightness. However, the reflective electrode has high contact resistance on the p-type compound semiconductor layer. Therefore, there are drawbacks in that the FCLED to which the reflective electrode is applied has a short life time and the characteristic of the FCLED is unstable.

To solve this problem, research related to electrode materials that have low contact resistance and high reflectance and a structure of electrode has been performed.

International Publication No. WO 01/47038 A1 discloses a technique about a semiconductor light emitting device to which a reflective electrode is applied. In this disclosure, an ohmic contact layer is interposed between the reflective electrode and the p-type compound semiconductor layer, but the materials (Ti, Ni/Au etc.) for forming the ohmic contact layer have low light transmittance. Therefore, there is a need to improve the light utilization efficiency and brightness.

SUMMARY OF THE DISCLOSURE

The present invention may provide a reflective electrode having low contact resistance, high reflectance, and improved electric conductivity and a compound semiconductor light emitting device having the same.

According to an aspect of the present invention, there may be provided a reflective electrode formed on a p-type compound semiconductor layer of a compound semiconductor light emitting device. The device may contain a first electrode layer formed one of a Ag and Ag-alloy which forms an ohmic contact with the p-type compound semiconductor layer; a third electrode layer formed of a material selected from the group consisting of Ni, Ni-alloy, Zn, Zn-alloy, Cu, Cu-alloy, Ru, Ir and Rh on the first electrode layer; and a fourth electrode layer formed of a light reflective material on the third electrode layer.

According to an aspect of the present invention, there may be provided a compound semiconductor light emitting device comprising an n-type electrode, a p-type electrode, and at least an n-type compound semiconductor layer, an active layer, and a p-type compound semiconductor layer between the n-type and p-type electrodes, wherein the p-type electrode includes a first electrode layer formed one of a Ag and Ag-alloy which forms an ohmic contact with the p-type compound semiconductor layer; a third electrode layer formed of a material selected from the group consisting of Ni, Ni-alloy, Zn, Zn-alloy, Cu, Cu-alloy, Ru, Ir and Rh on the first electrode layer; and a fourth electrode layer formed of a light reflective material on the third electrode layer.

The Ag-alloy may include at least a material selected from the group consisting of Mg, Zn, Sc, Hf, Zr, Te, Se, Ta, W, Nb, Cu, Si, Ni, Co, Mo, Cr, Mn, Hg, Pr and La. The thickness of the first electrode layer and the third electrode layer may be respectively in a range of about 0.1 to about 500 nm.

The light reflective material may be a material selected from the group consisting of Ag, Ag-alloy Al, Al-alloy, and Rh. The thickness of the fourth electrode layer may be in a range of about 10 to about 5000 nm.

The compound semiconductor light emitting device may further include a fifth electrode layer on the fourth electrode layer to prevent an agglomeration phenomenon that can occur during an annealing process on a surface of the fourth electrode layer. Here, the fifth electrode layer may be formed of a material selected from the group consisting of Cu, Cu/Ru, Cu/Ir, Cu-alloy, Cu-alloy/Ru and Cu-alloy/Ir. The thickness of the fifth electrode layer may be in a range of about 1 to about 500 nm.

The compound semiconductor light emitting device may further include a second electrode layer formed one of Ni and Ni-alloy between the first electrode layer and the third electrode layer. The thickness of the second electrode layer may be in a range of about 0.1 to about 500 nm.

The first electrode layer/third electrode layer, for example Ag/Ni, included in the reflective electrode of the compound semiconductor light emitting device may have a superior ohmic contact characteristic, low light absorbance and high light transmittance. Therefore, a compound semiconductor light emitting device having the reflective electrode according to the present invention may have a low operating voltage, an improved optical power and an improved current-voltage characteristic. The power consumption of the compound semiconductor light emitting device is low, thereby improving light emission efficiency of the compound semiconductor light emitting device.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE EXEMPLARY EMBODIMENTS

The present invention will now be described more fully with reference to the accompanying drawings in which exemplary embodiments of the invention are shown.

Figure 1:
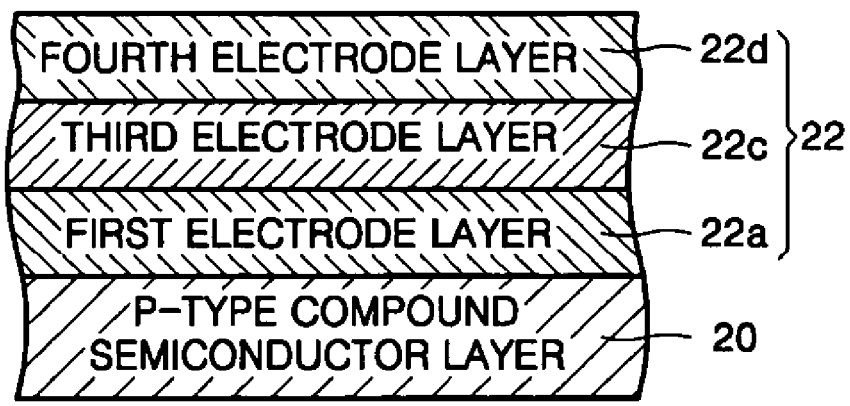
FIG. 1 is a cross-sectional view illustrating a reflective electrode according to a first embodiment of the present invention.

FIG. 1 is a cross-sectional view illustrating a reflective electrode according to a first embodiment of the present invention.

Referring to FIG. 1, a reflective electrode 22 may be formed on a p-type compound semiconductor layer 20. The reflective electrode 22 according to a first embodiment of the present invention may include sequentially formed a first electrode layer 22a, a third electrode layer 22c and a fourth electrode layer 22d on the p-type compound semiconductor layer 20.

The first electrode layer 22a may form an ohmic contact with the p-type compound semiconductor layer 20. The first electrode layer 22a may be formed one of Ag and Ag alloy with a thickness of about 0.1 to about 500 nm. Here, the Ag alloy may include at least one material selected from the group consisting of Mg, Zn, Sc, Hf, Zr, Te, Se, Ta, W, Nb, Cu, Si, Ni, Co, Mo, Cr, Mn, Hg, Pr and La.

The aforementioned Ag and the alloy metal elements may increase the characteristic of ohmic contact of the first electrode layer 22a. More specifically, the aforementioned Ag and the alloy metal elements may increase the effective carrier concentration of the p-type compound semiconductor layer 20 and have high reactivity with compounds that constitute the p-type compound semiconductor layer 20 except nitrogen.

For example, if the p-type compound semiconductor layer 20 is a GaN group compound, the aforementioned Ag and the alloy metal elements may preferentially react with Ga over nitrogen. In this case, gallium vacancies may be formed on a surface of the p-type compound semiconductor layer 20 as the result of reaction between Ga of the p-type compound semiconductor layer 20 and Ag or between Ga of the p-type compound semiconductor layer 20 and one of the aforementioned alloy metal elements. When the p-type compound semiconductor layer 20 is activated, the gallium vacancies formed on the p-type compound semiconductor layer 20 may act as a p-type dopant, i.e., an accepter, and increase effective carrier concentration of a surface of the p-type compound semiconductor layer 20.

The third electrode layer 22c may be formed of one material selected from the group consisting of Ni, Ni-alloy, Zn, Zn-alloy, Cu, Cu-alloy, Ru, Ir and Rh with a thickness of about 0.1 to about 500 nm.

The fourth electrode layer 22d may be formed of a light reflective material with a thickness of about 10 to about 5000 nm. The light reflective material may be a material selected from the group consisting of Ag, Ag-alloy, Al, Al-alloy and Rh, wherein the Ag-alloy includes all alloy materials that include Ag and the Al-alloy includes all alloy materials that include Al.

The first electrode layer 22a, the third electrode layer 22c and the fourth electrode layer 22d can be formed by an electron beam; an e-beam and thermal evaporator; physical vapor deposition (PVD); chemical vapor deposition (CVD); plasma laser deposition (PLD); or a dual-type thermal evaporator. At this time, deposition temperature is about 20 to about 1500° C. and pressure of the reactor is from atmospheric pressure to $10^{-12}$ torr.

An annealing process may be performed to the resultant product after forming the fourth electrode layer 22d. More specifically, the resultant product on which the fourth electrode layer 22d is formed may be annealed in the presence of a gas including at least one selected from the group consisting of nitrogen, argon, helium, oxygen, hydrogen and air at a temperature range of about 200 to about 700° C. for about 10 seconds to about 2 hours.

The annealing process may further be performed after forming the third electrode layer 22c. That is, the annealing process may be performed respectively after forming the third electrode layer 22c and the fourth electrode layer 22d. Accordingly, two times of annealing may be performed while manufacturing the reflective electrode 22.

The first electrode layer/third electrode layer, for example Ag/Ni, included in the reflective electrode 22 according to the present invention may have high ohmic contact characteristic, low light absorbance and high light transmittance. Therefore, the reflective electrode 22 according to the present invention may have low contact resistance, high reflectance and improved electric conductivity, thereby having high current-voltage characteristic.

Figure 2:
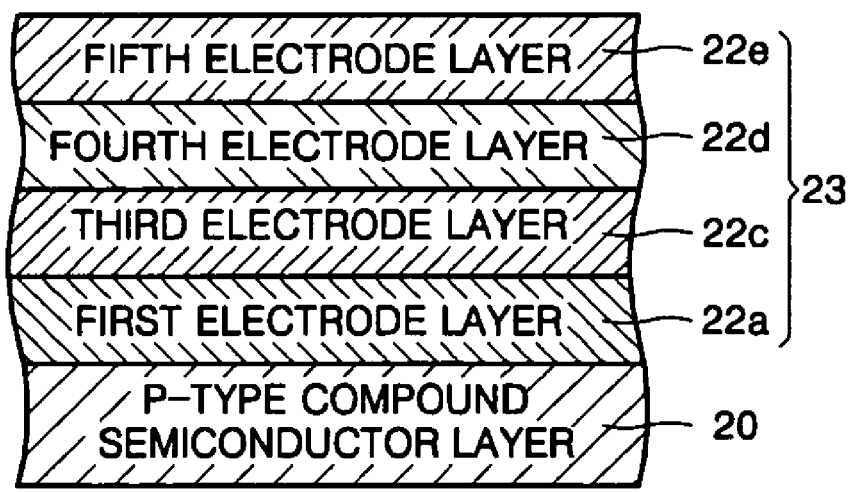
FIG. 2 is a cross-sectional view illustrating a reflective electrode according to a second embodiment of the present invention.

FIG. 2 is a cross-sectional view illustrating a reflective electrode according to a second embodiment of the present invention.

In the second embodiment of the present invention, mainly the differences from the first embodiment will be described. Like reference numerals refer to like elements in the drawings.

Referring to FIG. 2, a reflective electrode 23 according to the second embodiment of the present invention may further comprise a fifth electrode layer 22e on the fourth electrode layer 22d of FIG. 1.

The fifth electrode layer 22e may be formed of a material selected from the group consisting of Cu, Cu/Ru(Cu layer/Ru layer), Cu/Ir(Cu layer/Ir layer), Cu-alloy, Cu-alloy/Ru(Cu-alloy layer/Ru layer) and Cu-alloy/Ir(Cu-alloy layer/Ir layer)

with a thickness of about 1 to about 500 nm. The Cu-alloy denotes all alloy materials that include Cu.

The fifth electrode layer 22e can act as an agglomeration preventing layer for preventing the agglomeration of metal elements on a surface of the fourth electrode layer 22d during an annealing process.

More specifically, the p-type compound semiconductor layer 20 may have a different surface energy from the metal elements that constitute the fourth electrode layer 22d, such as Ag, Ag-alloy, Al, Al-alloy and Rh. It is well known that an agglomeration occurs on a surface of metal elements, that is, on a surface of the fourth electrode layer 22d during annealing due to the difference in surface energy of the metal elements. If there is an agglomeration on a surface of the fourth electrode layer 22d, the reflectance of the fourth electrode layer 22d may be reduced, thereby reducing the light emitting of the compound semiconductor light emitting device to which the reflective electrode 22 is applied.

The materials for forming the fifth electrode layer 22e may have a relatively small surface energy difference with the p-type compound semiconductor layer 20 and may have high electric conductivity. Therefore, the fifth electrode layer 22e formed on the fourth electrode layer 22d may act as an agglomeration preventing layer (APL) and an electrode.

The fifth electrode layer 22e may be formed by an electron beam; an e-beam and thermal evaporator; physical vapor deposition (PVD); chemical vapor deposition (CVD); plasma laser deposition (PLD); or a dual-type thermal evaporator. At this time, deposition temperature may be about 20 to about 1500° C. and pressure of the reactor is from about atmospheric pressure to about $10^{-12}$ torr.

An annealing process may be performed to the resultant product after forming the fifth electrode layer 22e. More specifically, the resultant product on which the fifth electrode layer 22e is formed may be annealed in the presence of a gas including at least one selected from the group consisting of nitrogen, argon, helium, oxygen, hydrogen and air at a temperature range of about 200 to about 700° C. for about 10 seconds to about 2 hours.

Figure 3:
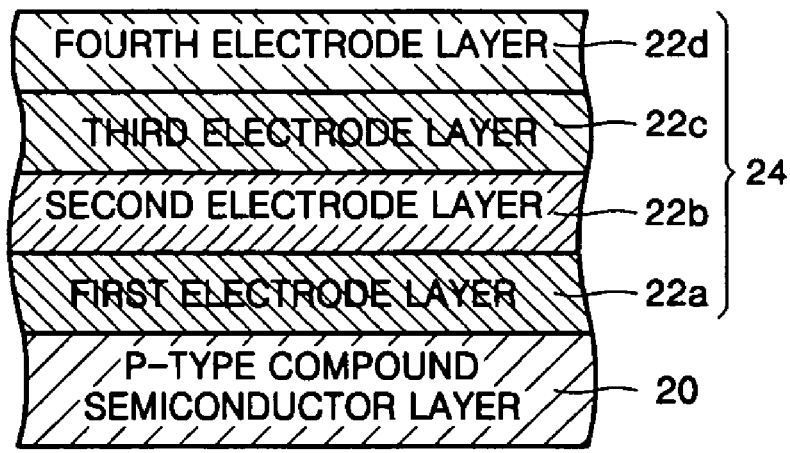
FIG. 3 is a cross-sectional view illustrating a reflective electrode according to a third embodiment of the present invention.

FIG. 3 is a cross-sectional view illustrating a reflective electrode according to a third embodiment of the present invention.

In the third embodiment of the present invention, mainly the differences from the first embodiment will be described. Like reference numerals refer to like elements in the drawings.

Referring to FIG. 2, a reflective electrode 24 according to the third embodiment of the present invention further comprises a second electrode layer 22b between the first electrode layer 22a and the third electrode layer 22c in the reflective electrode 22 of FIG. 1.

The second electrode layer 22b may be formed of Ni or Ni-alloy with a thickness of about 0.1 to about 500 nm.

The electric conductivity of the reflective electrode 24 may be increased by further including the second electrode layer 22b in the reflective electrode 24.

The second electrode layer 22b can be formed by an electron beam; an e-beam and thermal evaporator; physical vapor deposition (PVD); chemical vapor deposition (CVD); plasma laser deposition (PLD); or a dual-type thermal evaporator. At this time, deposition temperature may be about 20 to about 1500° C. and pressure of the reactor may be from about atmospheric pressure to about $10^{-12}$ torr.

Figure 4:
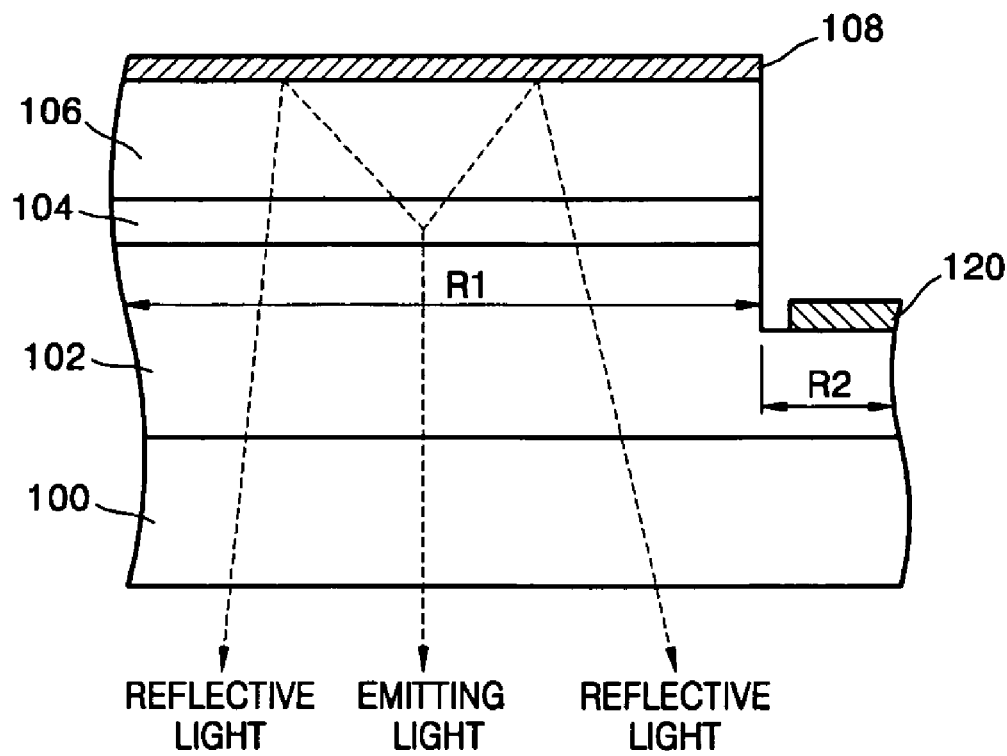
FIG. 4 is a cross-sectional view illustrating a compound semiconductor light emitting device having the reflective electrode according to the first embodiment of the present invention.

FIG. 4 is a cross-sectional view illustrating a compound semiconductor light emitting device having the reflective electrode according to the first embodiment of the present invention.

Referring to FIG. 4, a semiconductor light emitting device that includes the reflective electrode 22 according to a first embodiment of the present invention may include n-type and p-type electrodes 120 and 108 and at least an n-type compound semiconductor layer 102, an active layer 104, and a p-type compound semiconductor layer 106 between the n-type and p-type electrodes 120 and 108. The reflective electrode 22 of FIG. 1 is used as the p-type electrode 108. That is, the p-type electrode 108 may include the first electrode layer 22a, the third electrode layer 22c, and the fourth electrode layer 22d of FIG. 1, the functions and effect of which have already described.

The n-type compound semiconductor layer 102 may include a first compound semiconductor layer as a lower contact layer having a step difference stacked on an upper surface of a substrate 100 and a lower clad layer stacked on an upper surface of the first compound semiconductor layer. The n-type electrode 120 may be disposed on a portion where the step difference of the first compound semiconductor layer may be formed.

A sapphire substrate or a free standing GaN substrate may be mainly used as the substrate 100. The first compound semiconductor layer may be a nitride compound semiconductor layer of an III-V n-GaN group, desirably, an n-GaN layer. However, the present invention is not limited thereto and the compound semiconductor layer may be a different compound semiconductor layer of the III-V group that can generate a laser. The lower clad layer may be preferably a p-GaN/AlGaN layer having a predetermined reflective index, but may be a different compound semiconductor layer that can generate a laser.

The active layer 104 may be any material layer that can generate a laser, and preferably, a material layer that can generate a laser having a small critical current value and a stable cross mode characteristic. The active layer 104 may be a nitride compound semiconductor layer of an III-V GaN group which includes Al in a predetermined ratio as $In_xAl_yGa_{1-x-y}N$ ($0 \leq x \leq 1$, $0 \leq y \leq 1$, and $x+y \leq 1$). Here, the active layer 104 may have a structure of one of a multi quantum well and a single quantum well and the structure of the active layer 104 does not limit the technical sprit of the present invention.

An upper waveguide layer and a lower waveguide layer may further be formed on upper and lower surfaces of the active layer 104. The upper and lower waveguide layers may be formed of a material having less reflective index than that of the active layer 104, and preferably formed of a compound semiconductor layer of an III-V GaN group. The lower waveguide layer is an n-GaN layer and the upper waveguide layer may be a p-GaN layer.

The p-type compound semiconductor layer 106 may be stacked on an upper surface of the active layer 104 and may include an upper clad layer having a less reflective index than the active layer 104 and a second compound semiconductor layer stacked on an upper surface of the clad layer as an ohmic contact layer. The second compound semiconductor layer may be a nitride compound semiconductor layer of an III-V GaN group, and desirably, a p-GaN layer. However, the present invention is not limited thereto and the second compound semiconductor layer may be a different compound semiconductor layer of the III-V group that can generate a laser. The upper clad layer may be a p-GaN/AlGaN layer having a predetermined reflective index, but can be a different compound semiconductor layer that can generate a laser.

An n-type electrode 120 may be formed on the portion of the step difference of the first compound semiconductor layer which may be a lower ohmic contact layer. However, the n-type electrode 120 may be formed on the substrate 100 facing the p-type electrode 108. In this case, the substrate 100 may be formed of silicon carbide (SiC) or gallium nitride (GaN).

The first electrode layer/third electrode layer, for example Ag/Ni, included in the reflective electrode of the compound semiconductor light emitting device may have a superior ohmic contact characteristic, low light absorbance and high light transmittance. Therefore, a compound semiconductor light emitting device having the reflective electrode according to the present invention may have a low operating voltage, an improved optical power and an improved current-voltage characteristic. The power consumption of the compound semiconductor light emitting device may be low, thereby improving light emission efficiency of the compound semiconductor light emitting device.

Figure 5A:
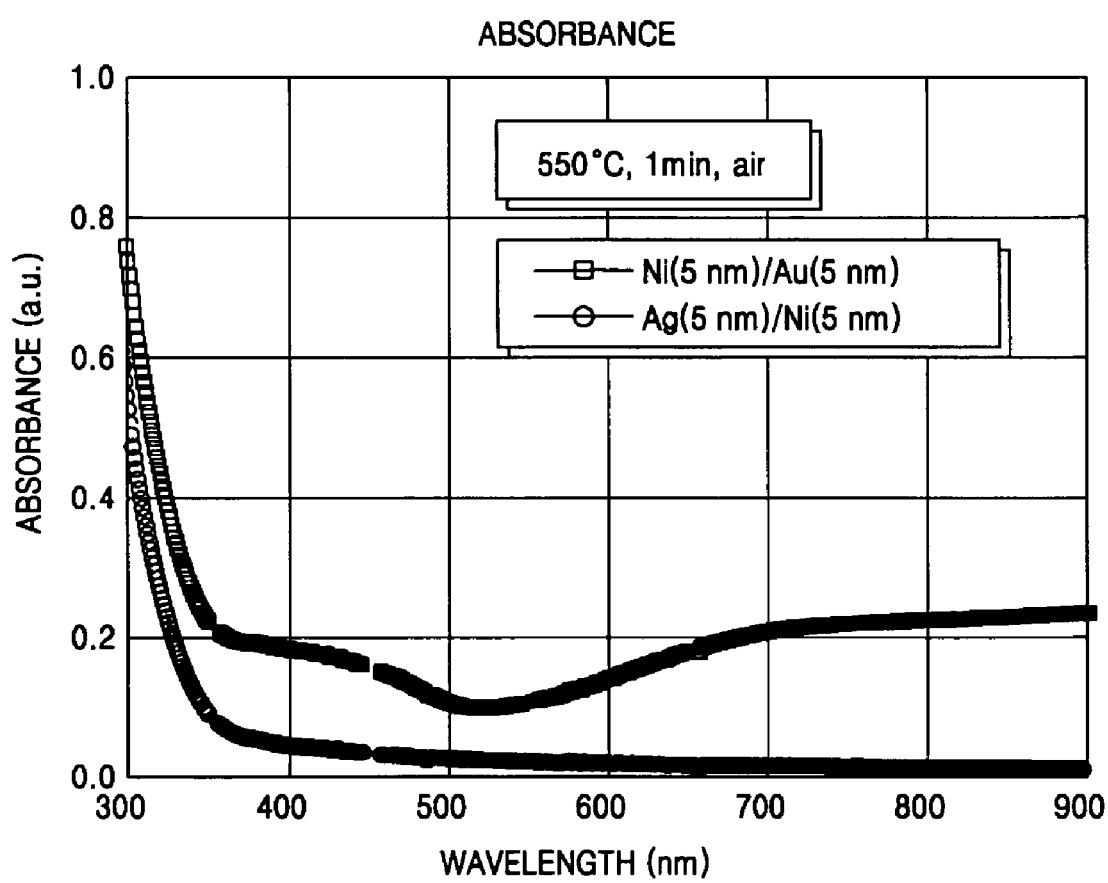
FIGS. 5A and 5B are graphs of measured light absorbance and light transmittance respectively with respect to first electrode layer/third electrode layer (Ag/Ni) that includes a reflective electrode according to the present invention.
Figure 5B:
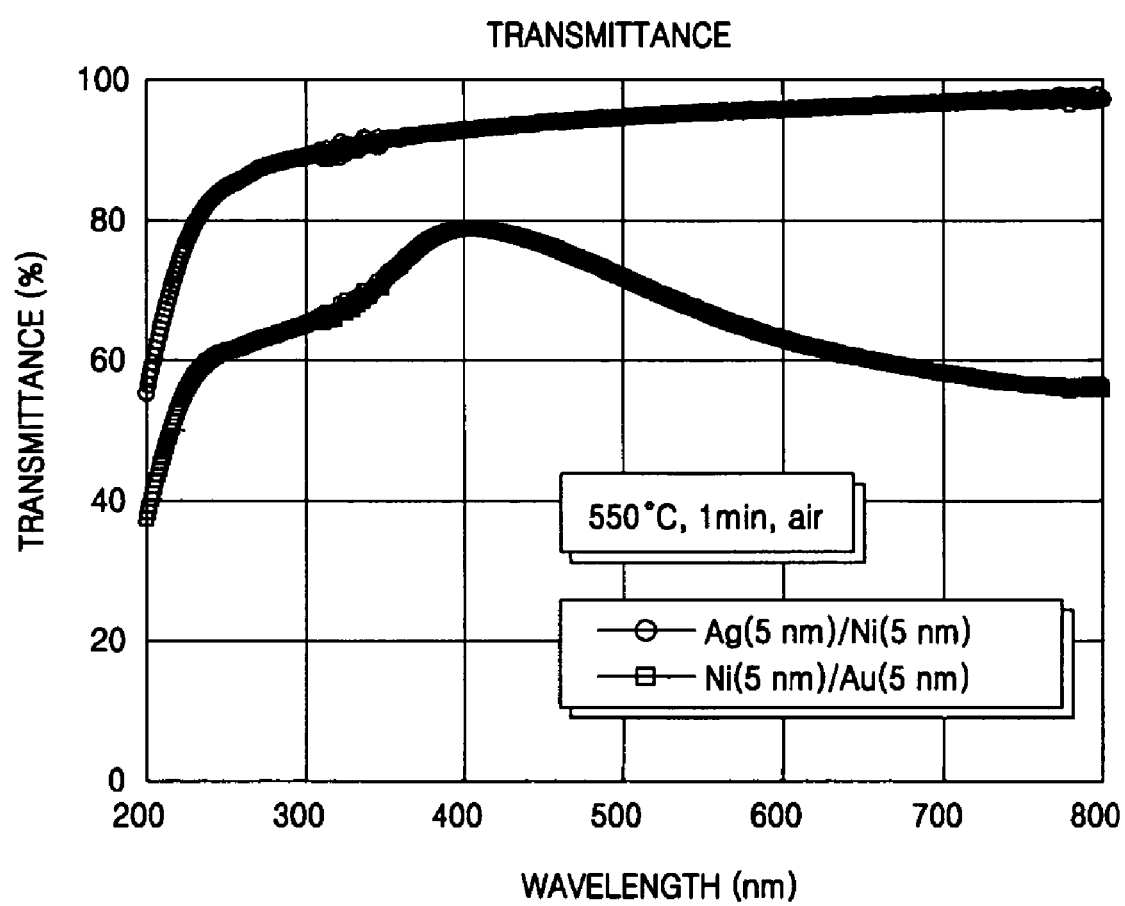

FIGS. 5A and 5B are graphs of measured light absorbance and light transmittance respectively with respect to first electrode layer/third electrode layer (Ag/Ni) that includes a reflective electrode. Here, the first electrode layer (Ag) and the third electrode layer (Ni) are formed in a thickness of 5 nm, respectively. The graphs also include the light transmittance and light absorbance of a conventional electrode layer (Ni/Au).

Referring to FIGS. 5A and 5B, the light absorbance of the Ag/Ni electrode layer is remarkably lower than that of the conventional Ni/Au electrode layer at a wavelength range of 400-800 nm. Also, the light transmittance of the Ag/Ni electrode layer at the wavelength of 400 nm is more than 90% which is greater than the light transmittance, i.e., less than 80%, of the conventional Ni/Au electrode layer.

Figure 6:
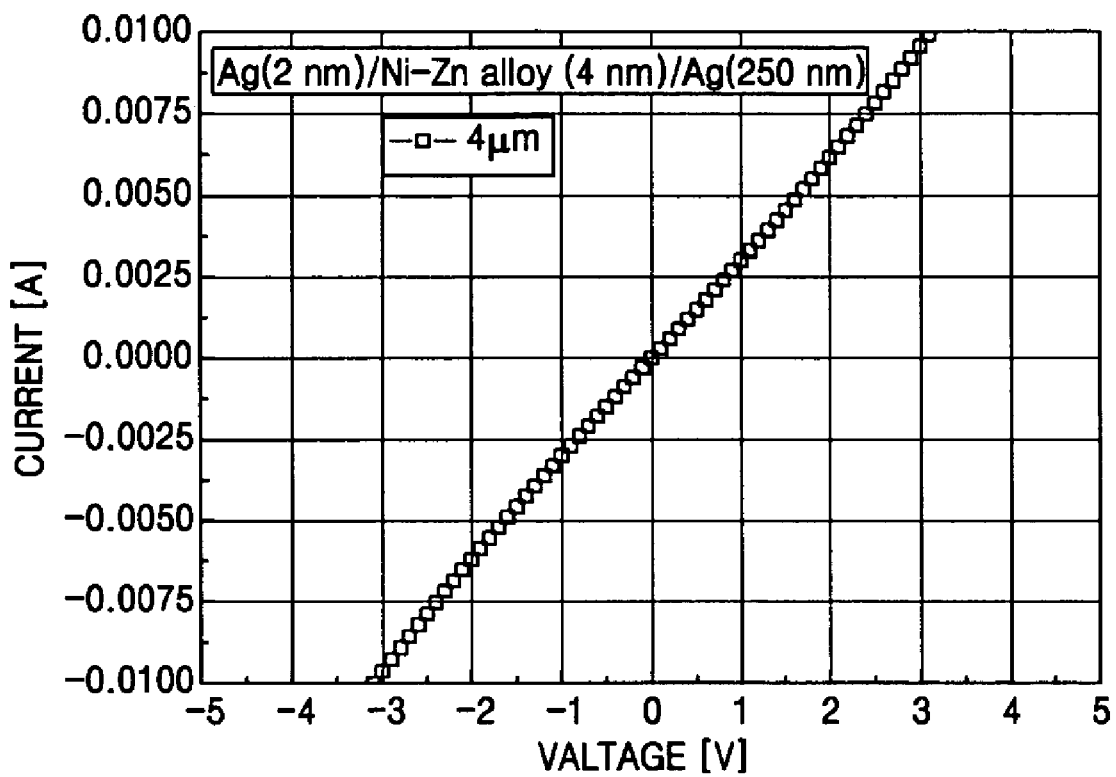
FIG. 6 is a graph of measured current-voltage characteristic with respect to a reflective electrode (Ag/Ni—Zn alloy/Ag) according to the first embodiment of the present invention.

FIG. 6 is a graph of measured current-voltage characteristic with respect to a reflective electrode (Ag/Ni—Zn alloy/Ag) according to the first embodiment of the present invention.

The reflective electrode of the first embodiment includes first electrode layer formed of Ag, the third electrode layer formed of Ni—Zn alloy, and the fourth electrode layer formed of Ag sequentially formed on the substrate. Each of the first electrode layer, the third electrode layer, and the fourth electrode layer has a thickness of 2 nm, 4 nm, and 250 nm, respectively. Two reflective electrodes separated from each other with a distance of 4 nm were formed on the substrate, and the current-voltage characteristics between the two electrodes were measured.

An annealing process was performed during manufacturing the reflective electrode (Ag/Ni—Zn alloy/Ag). The annealing process was performed after forming the first electrode layer and the third electrode layer at the presence of air for one minute, and another annealing process was performed after forming the fourth electrode layer at the same conditions.

<Experiment>

An experiment carried out by the inventor with respect to the reflective electrode will now be described. The technical sprit of the present invention is not limited to the exemplary method of forming the reflective electrode carried out by the inventor.

First, a surface of a precursor (a specimen) in which a p-type compound semiconductor layer formed of GaN as the main component is formed on a substrate is washed with trichloroethylene, acetone, methanol, and distilled water in an ultrasonic bath at 60° C. for 5 minutes each. Then, the precursor was hard baked for 10 minutes at 100° C. to remove remained moisture.

Afterward, a photoresist was spin coated on the p-type compound semiconductor layer at 4500 rpm. The specimen was soft baked at 85° C. for 15 minutes. After aligning a mask with the specimen, the specimen was exposed to an ultraviolet ray with an intensity of 22.8 mW for 15 second to develop a mask pattern. The specimen was developed by soaking in a developing solution diluted 4:1 in distilled water for approximately 25 second.

Afterward, the specimen was soaked in a BOE solution to remove a contaminant layer on the specimen. Next, Ag was placed on a reaction object mounting stage in an electron-beam evaporator chamber, and a first electrode layer was deposited with Ag using the electron-beam evaporator.

After depositing a third electrode layer with Ni on the first electrode layer and performing a lift-off process with acetone, the resultant product was annealed in a rapid thermal annealing (RTA) furnace at temperature of 430-530° C. for one minute in the presence of air. A fourth electrode layer was deposited with Ag on the third electrode layer in the electron-beam evaporator. The resultant product on which the fourth electrode layer is formed was annealed under the same conditions as the first annealing.

This embodiment can be applied to the method of manufacturing the light emitting device depicted in FIG. 4.

The reflective electrode according to the present invention may have low contact resistance, high reflectance, and an improved electric conductivity, thereby having a high current-voltage characteristic.

The compound semiconductor light emitting device having the reflective electrode may have low operating voltage, improved optical power, and an improved current-voltage characteristic. The power consumption of the compound semiconductor light emitting device may be low, thereby improving light emitting efficiency of the compound semiconductor light emitting device.

The first electrode layer according to the present invention may be applied to a light emitting diode (LED) or a laser diode (LD).

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A reflective electrode formed on a p-type compound semiconductor layer of a compound semiconductor light emitting device comprising:

a first electrode layer comprising Ag or Ag-alloy which forms an ohmic contact with the p-type compound semiconductor layer;

a third electrode layer comprising a material selected from the group consisting of Zn and Zn-alloy formed directly on and adjacent the first electrode layer; and a fourth electrode layer comprising a light reflective material formed directly on and adjacent the third electrode layer.

2. The reflective electrode of claim 1, wherein the Ag-alloy includes at least one material selected from the group consisting of Mg, Zn, Sc, Hf, Zr, Te, Se, Ta, W, Nb, Cu, Si, Ni, Co, Mo, Cr, Mn, Hg, Pr, and La.

3. The reflective electrode of claim 1, wherein the thickness of the first electrode layer and the third electrode layer are respectively in a range of about 0.1 to about 500 nm.

4. The reflective electrode of claim 1, wherein the light reflective material is a material selected from the group consisting of Ag, Ag-alloy, Al, Al-alloy and Rh.

5. The reflective electrode of claim 4, wherein the thickness of the fourth electrode layer is in a range of about 10 to about 5000 nm.

6. The reflective electrode of claim 1, further comprising a fifth electrode layer on the fourth electrode layer to prevent an agglomeration phenomenon that can occur during an annealing process on a surface of the fourth electrode layer.

7. The reflective electrode of claim 6, wherein the fifth electrode layer comprises a material selected from the group consisting of Cu, Cu/Ru, Cu/Ir, Cu-alloy, Cu-alloy/Ru, and Cu-alloy/Ir.

8. The reflective electrode of claim 7, wherein the thickness of the fifth electrode layer is in a range of about 1 to about 500 nm.

9. A reflective electrode formed on a p-type compound semiconductor layer of a compound semiconductor light emitting device comprising:
 a first electrode layer comprising Ag or Ag-alloy which forms an ohmic contact with the p-type compound semiconductor layer;
 a second electrode layer comprising Ni or Ni-alloy directly on and adjacent the first electrode layer;
 a third electrode layer comprising a material selected from the group consisting of Zn and Zn-alloy formed directly on and adjacent the second electrode layer; and
 a fourth electrode layer comprising a light reflective material formed directly on and adjacent the third electrode layer.

10. The reflective electrode of claim 9, wherein the thickness of the second electrode layer is in a range of about 0.1 to about 500 nm.

11. A compound semiconductor light emitting device comprising:
 an n-type electrode;
 a p-type electrode; and
 at least an n-type compound semiconductor layer, an active layer, and a p-type compound semiconductor layer between the n-type and p-type electrodes,
 wherein the p-type electrode includes:
 a first electrode layer comprising Ag or Ag-alloy which forms an ohmic contact with the p-type compound semiconductor layer;
 a third electrode layer comprising a material selected from the group consisting of Zn and Zn-alloy directly on and adjacent the first electrode layer; and
 a fourth electrode layer formed of a light reflective material directly on and adjacent the third electrode layer.

12. The compound semiconductor light emitting device of claim 11, wherein the Ag-alloy includes at least a material selected from the group consisting of Mg, Zn, Sc, Hf, Zr, Te, Se, Ta, W, Nb, Cu, Si, Ni, Co, Mo, Cr, Mn, Hg, Pr and La.

13. The compound semiconductor light emitting device of claim 11, wherein the thickness of the first electrode layer and the third electrode layer are respectively in a range of about 0.1 to about 500 nm.

14. The compound semiconductor light emitting device of claim 11, wherein the light reflective material is selected from the group consisting of Ag, Ag-alloy, Al, Al-alloy, and Rh.

15. The compound semiconductor light emitting device of claim 14, wherein the thickness of the fourth electrode layer is in a range of about 10 to about 5000 nm.

16. The compound semiconductor light emitting device of claim 11, further comprising a fifth electrode layer on the fourth electrode layer to prevent an agglomeration phenomenon that can occur during an annealing process on a surface of the fourth electrode layer.

17. The compound semiconductor light emitting device of claim 16, wherein the fifth electrode layer comprises a material selected from the group consisting of Cu, Cu/Ru, Cu/Ir, Cu-alloy, Cu-alloy/Ru, and Cu-alloy/Ir.

18. The compound semiconductor light emitting device of claim 17, wherein the thickness of the fifth electrode layer is in a range of about 1 to about 500 nm.

19. A compound semiconductor light emitting device comprising:
 an n-type electrode;
 a p-type electrode; and
 at least an n-type compound semiconductor layer, an active layer, and a p-type compound semiconductor layer between the n-type and p-type electrodes,
 wherein the p-type electrode includes:
 a first electrode layer comprising Ag or Ag-alloy which forms an ohmic contact with the p-type compound semiconductor layer;
 a second electrode layer comprising Ni or Ni-alloy directly on and adjacent the first electrode layer;
 a third electrode layer comprising a material selected from the group consisting of Zn and Zn-alloy directly on and adjacent the second electrode layer; and
 a fourth electrode layer formed of a light reflective material directly on and adjacent the third electrode layer.

20. The compound semiconductor light emitting device of claim 19, wherein the thickness of the second electrode layer is in a range of about 0.1 to about 500 nm.

21. The reflective electrode of claim 6, wherein the fifth electrode layer has a small surface energy difference with the p-type compound semiconductor layer.

22. The compound semiconductor light emitting device of claim 16, wherein the fifth electrode layer has a small surface energy difference with the p-type compound semiconductor layer.

* * * * *